United States Patent
Tanaka et al.

(10) Patent No.: US 8,519,363 B2
(45) Date of Patent: Aug. 27, 2013

(54) WAFER HANDLING METHOD AND ION IMPLANTER

(75) Inventors: Kohei Tanaka, Kyoto (JP); Takashi Nogami, Kyoto (JP); Masayoshi Hino, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 170 days.

(21) Appl. No.: 12/938,856

(22) Filed: Nov. 3, 2010

(65) Prior Publication Data
US 2011/0248190 A1 Oct. 13, 2011

(30) Foreign Application Priority Data
Apr. 9, 2010 (JP) ................................. 2010-090087

(51) Int. Cl.
*H01J 37/22* (2006.01)
*H01J 37/20* (2006.01)
*H01J 37/317* (2006.01)

(52) U.S. Cl.
CPC ................................. *H01J 37/3171* (2013.01)
USPC ................................. 250/491.1; 250/492.21

(58) Field of Classification Search
USPC ......................................... 250/491.1, 492.21
See application file for complete search history.

(56) References Cited

U.S. PATENT DOCUMENTS

| | | | |
|---|---|---|---|
| 5,003,183 A | 3/1991 | Nogami et al. | |
| 6,114,705 A * | 9/2000 | Leavitt et al. | 250/442.11 |
| 6,748,293 B1 * | 6/2004 | Larsen | 700/218 |
| 7,327,450 B2 * | 2/2008 | Kreh et al. | 356/237.5 |
| 7,519,448 B2 * | 4/2009 | Ikeda et al. | 700/114 |
| 7,612,351 B2 * | 11/2009 | Kim | 250/492.21 |
| 2004/0191028 A1 | 9/2004 | Tamai | |
| 2005/0251279 A1 * | 11/2005 | Ray | 700/114 |

FOREIGN PATENT DOCUMENTS

| JP | 7-54688 | 6/1995 |
|---|---|---|
| JP | 2005-39285 | 2/2005 |

* cited by examiner

*Primary Examiner* — Jack Berman
*Assistant Examiner* — Eliza Osenbaugh-Stewart
(74) *Attorney, Agent, or Firm* — Osha Liang LLP

(57) ABSTRACT

An ion implanter performs ion implantation by irradiating a wafer having a notch at its outer peripheral region by an ion beam. In ion implanter, a twist angle adjustment mechanism is configured to adjust a twist angle, an aligner is configured to adjust an alignment angle, a wafer transfer device is configured to transfer the wafer between the aligner and the twist angle adjustment mechanism, an image processing device is configured to detect the twist angle of the wafer on the twist angle adjustment mechanism, and a control device is configured to carry out a twist control in which the wafer is rotated by the twist angle adjustment mechanism by an angle obtained from a first difference between the detected twist angle and the alignment angle and a second difference between the alignment angle and a target twist angle given as one of ion implantation conditions.

19 Claims, 9 Drawing Sheets

WAFER HANDLING METHOD AND ION IMPLANTER

CROSS REFERENCE TO RELATED APPLICATION(S)

This application is based upon and claims the benefit of priority from Japanese Patent Application No. 2010-90087 filed on Apr. 9, 2010, the entire contents of which are incorporated herein by reference.

1. Field

The present disclosure relates to: a wafer handling method for performing wafer transfer, twist angle adjustment, etc. in an ion implanter in which ion implantation is performed by irradiating a wafer with an ion beam; and an ion implanter for carrying out the wafer handling method.

2. Description Of The Related Art

For example, Patent Documents 1 and 2 each disclose an ion implanter in which a wafer is held on a platen provided in an implantation chamber and the wafer is irradiated with an ion beam, thereby performing ion implantation. The ion implanter includes: a platen drive device having a mechanism for bringing the platen to a horizontal state and a raised state, a mechanism for mechanically scanning the platen in a direction intersecting the ion beam, and a twist angle adjustment mechanism for adjusting a twist angle of the wafer on the platen by rotating the platen; an aligner, which is provided inside or outside the implantation chamber, for rotating the wafer to adjust an alignment angle of the wafer; and a wafer transfer device for transferring the wafer between the aligner and the twist angle adjustment mechanism of the platen drive device.

In the ion implanter disclosed in Patent Document 1, the aligner is provided outside the implantation chamber. In the ion implanter disclosed in Patent Document 2, the aligner may be provided inside the implantation chamber because a rotation table for rotating the wafer can be rotated inside the implantation chamber.

In the ion implanter disclosed in each of Patent Documents 1 and 2, the platen and a rotation mechanism for rotating the platen constitute the twist angle adjustment mechanism.

As illustrated in an example presented in FIG. 1, for instance, a notch 4 of the wafer is a notch provided at an outer peripheral region of a wafer 2 in order to facilitate, for example, determination and alignment of a crystal orientation of the wafer 2.

As illustrated in the example presented in FIG. 1, for instance, a twist angle $\beta$ of the wafer is an angle of the notch 4 of the wafer 2 on the twist angle adjustment mechanism, which is formed with respect to a given reference position 92. The reference position 92 is, for example, a vertical line when the wafer 2 is raised for ion implantation. The wafer 2 is rotated around a center $2a$ thereof to adjust the twist angle $\beta$.

An alignment angle is an angle of the notch 4, which is formed with respect to a given reference position and is adjusted by the aligner. When a positional deviation (i.e., a "notch angle deviation") does not occur in the wafer in its circumferential direction (rotation direction) in the course of wafer transfer (note that the deviation will be referred to as a "notch angle deviation" in the following description), the alignment angle and the twist angle $\beta$ have a certain relationship decided in accordance with an apparatus structure.

For example, in the related-art ion implanter such as one disclosed in Patent Document 1 or 2, the alignment angle is adjusted to 0 degree by the aligner (First Step).

Subsequently, the wafer is transferred from the aligner to the twist angle adjustment mechanism (more specifically, the platen thereof) of the platen drive device by the wafer transfer device (Second Step). In this case, when a positional deviation does not occur in the wafer in its circumferential direction in the course of the transfer, the twist angle $\beta$ of the wafer on the platen becomes 0 degree. This angle serves as the reference used in the next step.

Then, assuming that the twist angle $\beta$ is 0 degree, the platen and the wafer are rotated by a given angle using the twist angle adjustment mechanism, thereby adjusting the twist angle $\beta$ to a target twist angle given as one of ion implantation conditions (recipes) (Third Step). For example, when the target twist angle $\beta$ given as one of ion implantation conditions is 50 degrees, the wafer is rotated by 50 degrees.

Thereafter, when ion implantation is performed, the platen and the wafer are each brought to a raised state, and the wafer is irradiated with an ion beam, thereby performing ion implantation.

PRIOR ART REFERENCE

Patent Document

[Patent Document 1] Japanese Unexamined Patent Application Publication No. 2005-39285

[Patent Document 2] Japanese Examined Patent Application Publication No. 7-54688

A circumferential positional deviation might occur in the wafer by some kind of cause (such as vibration created at the time of wafer conveyance, for example) in the course of the transfer of the wafer to the platen after the alignment angle adjustment performed by the aligner. In that case, in the related-art techniques, the twist angle of the wafer is adjusted with the positional deviation thereof included therein because there exists neither means for detecting the positional deviation nor means for correcting the positional deviation, and therefore, an error is caused in the twist angle.

For a recent ion implanter, it is desired that accuracy of ion implantation be further increased. As one of means for increasing ion implantation accuracy, the twist angle is desired to be accurately adjusted to a target twist angle given as one of ion implantation conditions.

SUMMARY

Exemplary embodiments of the present invention provide a wafer handling method and an ion implanter that are capable of accurately adjusting a twist angle of a wafer to a target twist angle given as one of ion implantation conditions.

A wafer handing method, according to a first aspect of the invention, performed in an ion implanter including a platen configured to hold a wafer having a notch at its outer peripheral region, a twist angle adjustment mechanism configured to adjust a twist angle, which is an angle of the notch of the wafer with respect to a first reference position and an aligner configured to adjust an alignment angle, which is an angle of the notch of the wafer with respect to a second reference position, the method comprises:

adjusting an alignment angle while rotating the wafer by the aligner;

transferring the wafer from the aligner to the twist angle adjustment mechanism, after adjusting the alignment angle;

irradiating the outer peripheral region of the wafer on the twist angle adjustment mechanism with a light from a first side of the wafer, after transferring the wafer;

taking an image of the wafer on the twist angle adjustment mechanism from a second side of the wafer;

detecting the twist angle of the wafer on the twist angle adjustment mechanism based on the image of the wafer; and performing a twist control in which the wafer is rotated by the twist angle adjustment mechanism by an angle obtained from a first difference between the detected twist angle and the alignment angle and a second difference between the alignment angle and a target twist angle given as one of ion implantation conditions.

In the twist control, the twist angle of the notch of the wafer on the twist angle adjustment mechanism is detected, the second difference between the alignment angle and the target twist angle given as one of the ion implantation conditions is factored into the first difference between the detected twist angle and the alignment angle so as to obtain an angle, and the wafer is rotated by the obtained angle by the twist angle adjustment mechanism so that the twist angle of the notch of the wafer on the twist angle adjustment mechanism coincides with the target twist angle given as one of the ion implantation conditions. Hence, even if a circumferential positional deviation has occurred in the wafer in the course of the transfer of the wafer, this positional deviation is detected as the first difference between the detected twist angle of the wafer on the twist angle adjustment mechanism and the alignment angle. Then, the twist angle is adjusted by rotating the wafer in consideration of this first difference, and therefore, the twist angle of the wafer can be accurately adjusted to the target twist angle given as one of the ion implantation conditions.

According to a second aspect of the invention, in the wafer handling method, the alignment angle may be adjusted so that the notch of the wafer is located within the light irradiation region closest to the target twist angle.

According to a third aspect of the invention, in the wafer handling method, the light may be emitted from a light source, the light emitted from the light source may be guided by a light guide and, the light emitted from the light guide may be reflected by a reflector, thereby forming the light irradiation regions.

According to a fourth aspect of the invention, in the wafer handling method, in the wafer handling method, a radial positional deviation of the center position from a reference position of the wafer is detected, with the wafer held above the twist angle adjustment mechanism by the transfer arm.

An ion implanter, according to a fifth aspect of the invention, in which ion implantation is performed by irradiating a wafer having a notch at its outer peripheral region by an ion beam, comprises:

a platen configured to hold the wafer;

a twist angle adjustment mechanism configured to adjust a twist angle, which is an angle of the notch of the wafer with respect to a first reference position, by rotating the wafer;

an aligner configured to adjust an alignment angle, which is an angle of the notch of the wafer with respect to a second reference position, by rotating the wafer;

a wafer transfer device configured to transfer the wafer between the aligner and the twist angle adjustment mechanism;

a light source section configured to irradiate the outer peripheral region of the wafer on the twist angle adjustment mechanism with a light from a first side of the wafer;

a camera configured to take an image of the wafer on the twist angle adjustment mechanism from a second side of the wafer;

an image processing device configured to process image data supplied from the camera to detect the twist angle of the wafer on the twist angle adjustment mechanism; and a control device configured to carry out a twist control in which the wafer is rotated by the twist angle adjustment mechanism by an angle obtained from a first difference between the detected twist angle and the alignment angle and a second difference between the alignment angle and a target twist angle given as one of ion implantation conditions.

The control device may be configured to carry out an alignment control in which the alignment angle is adjusted using the aligner so that the notch of the wafer on the twist angle adjustment mechanism is located within one of the light irradiation regions when the twist control is carried out.

According to a sixth aspect of the invention, in the alignment control, the control device may be configured to adjust the alignment angle so that the notch of the wafer is located within the light irradiation region closest to the target twist angle.

According to a seventh aspect of the invention, the light source section may include a light source configured to emit light, a light guide configured to guide the light emitted from the light source, and a reflector configured to reflect the light emitted from the light guide, thereby forming the light irradiation regions.

According to an eighth aspect of the invention, the image processing device is configured to detect a radial positional deviation of the center position from a reference position of the wafer is detected, with the wafer held above the twist angle adjustment mechanism by the transfer arm.

According to the first or fifth aspect of the invention, even if a circumferential positional deviation has occurred in the wafer in the course of the transfer of the wafer, this positional deviation is detected as the first difference between the detected twist angle of the wafer on the twist angle adjustment mechanism and the alignment angle. Then, the twist angle is adjusted by rotating the wafer in consideration of this first difference, and therefore, the twist angle of the wafer can be accurately adjusted to the target twist angle given as one of the ion implantation conditions.

According to the second or sixth aspect of the invention, the following effects are further achieved. Specifically, the alignment angle is adjusted so that the notch of the wafer is located within the light irradiation region closest to the target twist angle given as one of the ion implantation conditions, and therefore, the second difference between the alignment angle and the target twist angle given as one of ion implantation conditions can be reduced. As a result, the angle at which the wafer is rotated in the twist control can be reduced, thus making it possible to reduce time required for the twist angle adjustment.

According to the third or seventh aspect of the invention, the following effects are further achieved. Specifically, the light emitted from the light guide is reflected by the reflector inside the implantation chamber to form the light irradiation regions, thus making it possible to widen the light emitted from the light guide, and to widen the respective light irradiation regions. As a result, the range of options for the alignment angle is extended, thus further facilitating the adjustment of the alignment angle.

Besides, when the light with which the outer peripheral region of the wafer is irradiated is excessively intense, a concave image similar to the notch appears due to a diffraction phenomenon of the light, and this image might be erroneously detected as the notch; nevertheless, when the light is simply reduced in intensity, the light irradiation regions are narrowed. To cope with this dilemma, the light is reflected by the reflector, and the brightness of the light irradiation regions is thus moderately reduced, thereby making it possible to obtain both of: the effect of preventing erroneous detection caused by the above-mentioned diffraction phenomenon of the light; and the effect of widening the respective light irradiation regions.

According to the fourth or eighth aspect of the invention, the following effects are further achieved. Specifically, with the wafer held above the twist angle adjustment mechanism of the platen drive device by the transfer arm, detecting the radial positional deviation of the wafer is further carried out using the image processing device, thus making it possible to detect the positional deviation of the wafer on the transfer arm. Further, the detection result is used to take an action such as suspension of the transfer of the wafer, for example, and thus can serve to prevent abnormal transfer of the wafer, ion implantation failure, etc. from occurring. Besides, structure simplification can be achieved since the detection can be carried out by utilizing the light source, the light guide, the camera, the image processing device, etc., which are provided in order to accurately adjust the twist angle of the wafer.

Other features and advantages may be apparent from the following detailed description, the accompanying drawings and the claims.

DETAILED DESCRIPTION (First Embodiment)

Figure 2:
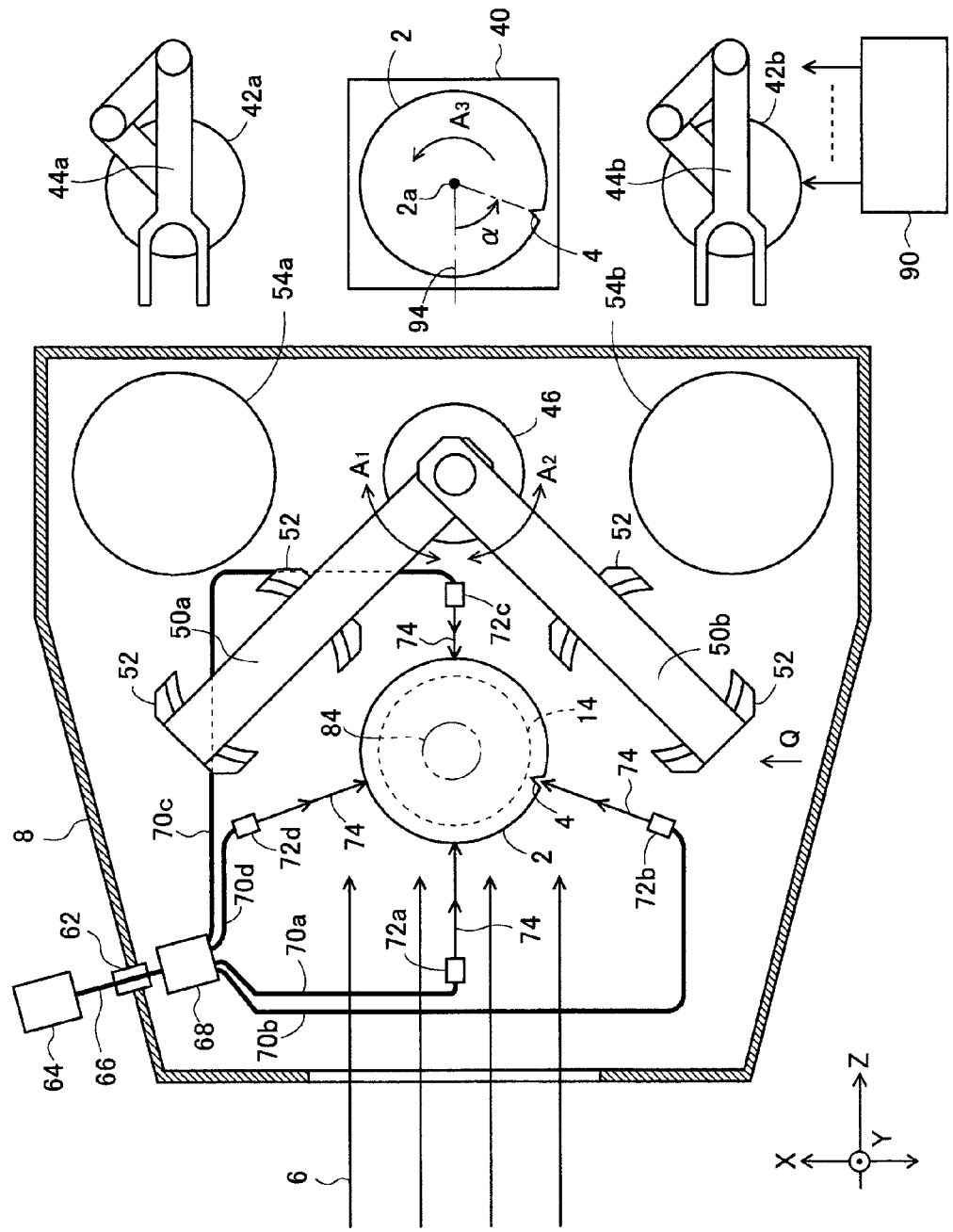
FIG. 2 is a plane view of an ion implanter carrying out a wafer handing method according to a first embodiment.
Figure 3:
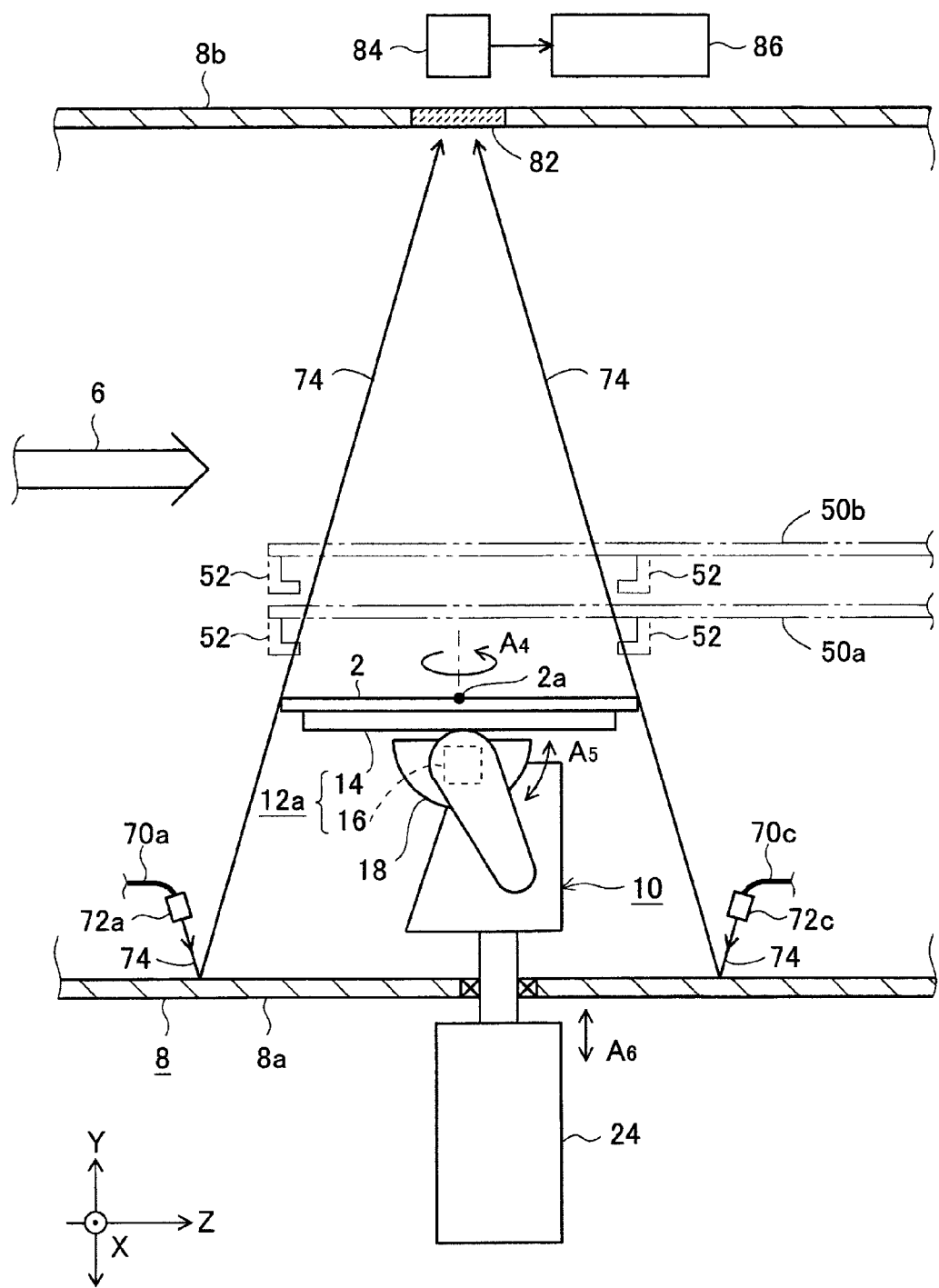
FIG. 3 is a side view showing the ion implanter of FIG. 2 when viewed from an arrow Q direction.

In FIGS. 2 and 3, there is illustrated an ion implanter of a first embodiment for carrying out a wafer handling method according to the present invention.

In this ion implanter, a wafer 2 having a notch 4, such as one described above (see FIG. 1 and description thereof), is held on a platen 14 provided inside an implantation chamber 8, and the wafer 2 is irradiated with an ion beam 6, thereby performing ion implantation. The implantation chamber 8 enters a vacuum state by exhausting air therefrom by an unillustrated evacuation device.

For ease of understanding of directions, an X direction, a Y direction and a Z direction, which are orthogonal to one another at a point, are illustrated in the diagrams. For example, each of the X direction and the Z direction is a horizontal direction, and the Y direction is a vertical direction. The ion beam 6 travels in the Z direction in this example.

The wafer 2 is a silicon wafer, for example, but is not limited to this.

Although the ion beam 6 has a ribbon-like shape, the dimensions thereof are larger in the X direction than in the Y direction due to scanning in the X direction in the present embodiment, the present invention is not limited to this, but the ion beam 6 may have, for example, a ribbon-like shape without going through scanning in the X direction.

For example, the platen 14 includes an electrostatic chuck that holds the wafer 2 by attracting the wafer 2 thereto by static electricity, or includes the electrostatic chuck and a support member thereof, but the present invention is not limited to this.

The platen 14 has a diameter smaller than that of the wafer 2. Accordingly, the wafer 2 held on the platen 14 will be in a state in which the entire perimeter of a peripheral edge region of the wafer 2 is protruded from the platen 14. Since the notch 4 of the wafer 2 is small, the notch 4 will also be in a state in which the notch 4 is protruded from the platen 14.

Figure 4:
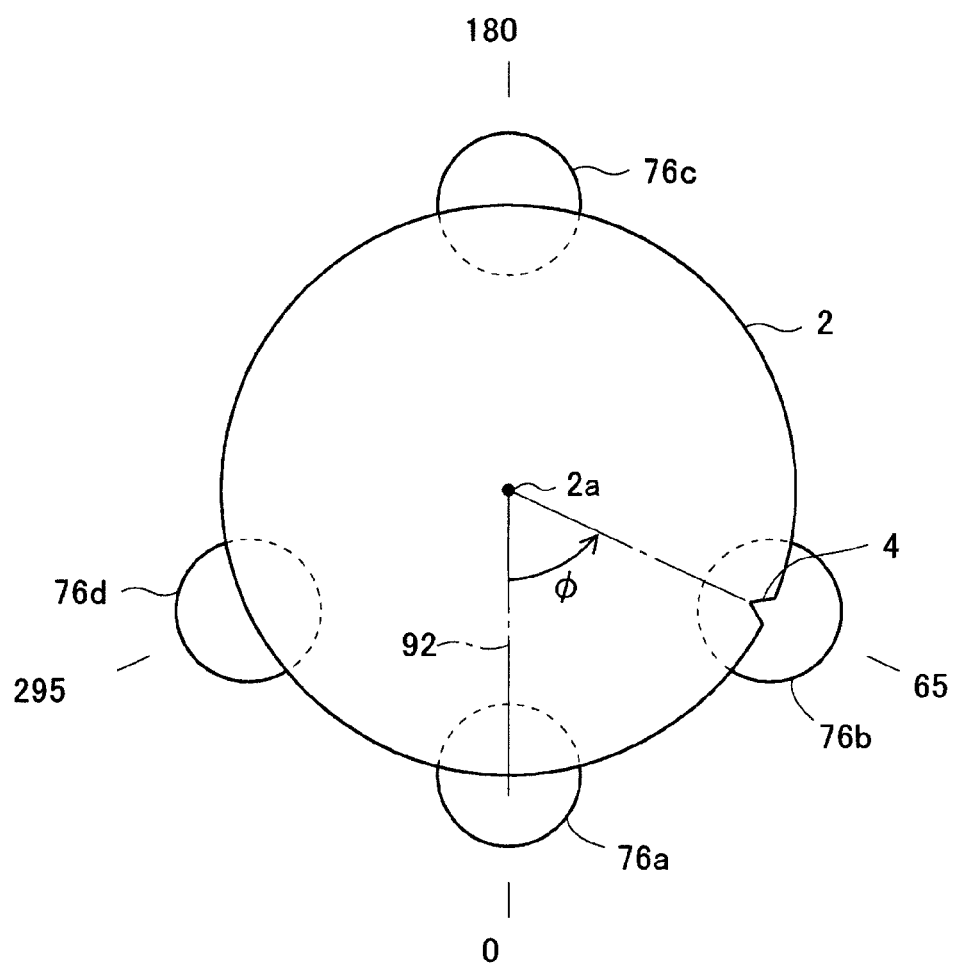
FIG. 4 is a plane view showing an example of light irradiation regions in an outer peripheral region of the wafer.

Note that the positions of the notch 4 of the wafer 2 illustrated in FIG. 2, FIG. 4, etc. are provided by way of example only.

This ion implanter includes a platen drive device 10, an aligner 40, and a wafer transfer device.

The platen drive device 10 has a structure similar to that of a holder drive device described in Japanese Unexamined Patent Application Publication No. 2004-95434, for example. The platen drive device 10 includes: a rotation mechanism (twist rotation mechanism) 16 for rotating, together with the wafer 2, the platen 14 around a center $2a$ in a direction indicated by an arrow $A_4$ (or in a direction opposite thereto); a rotation mechanism (tilt rotation mechanism) 18 for bringing the platen 14 and the wafer 2 to horizontal states and raised states by rotating, together with the wafer 2 and the rotation mechanism 16, the platen 14 in a reciprocating manner as indicated by an arrow $A_5$; and a scanning mechanism 24 for mechanically scanning (moving up or down) the platen 14 together with the mechanisms in a direction intersecting the ion beam 6 (e.g., in the Y direction) as indicated by an arrow $A_6$.

In the present embodiment, the above-mentioned platen 14 and its rotation mechanism 16 constitute a twist angle adjustment mechanism $12a$ for adjusting a twist angle of the wafer 2 by rotating the wafer 2 that has been held on the platen 14. Accordingly, in the following description, the transfer of the wafer 2 to the twist angle adjustment mechanism $12a$ more specifically means the transfer of the wafer 2 to the platen 14 included in the twist angle adjustment mechanism $12a$, and the wafer 2 or the like on the twist angle adjustment mechanism $12a$ more specifically means the wafer 2 or the like on the platen 14.

The platen 14 and the wafer 2 are scanned in the Y direction with the platen 14 and the wafer 2 raised at a given angle (e.g., at a vertical angle or at an angle inclined by a given tilt angle therefrom), thereby irradiating the entire surface of the wafer 2 with the ion beam 6 to perform ion implantation. With the platen 14 horizontally placed, the wafer 2 is passed to the platen 14, and an angle of the notch 4 of the wafer 2 is detected, for example. In the following description, the platen 14 is in the horizontal state unless otherwise specified. The same goes for the case where an after-mentioned twist angle adjustment mechanism $12b$ is employed.

The aligner 40 may be provided inside the implantation chamber 8, but is provided outside the implantation chamber 8 (i.e., at an atmospheric side) in the present embodiment. This aligner 40 has a known structure, and rotates the wafer 2 around its center $2a$ as indicated by an arrow $A_3$, for example, thereby adjusting an alignment angle α that is an angle of the notch 4 of the wafer 2, formed with respect to a given reference position 94.

Figure 1:
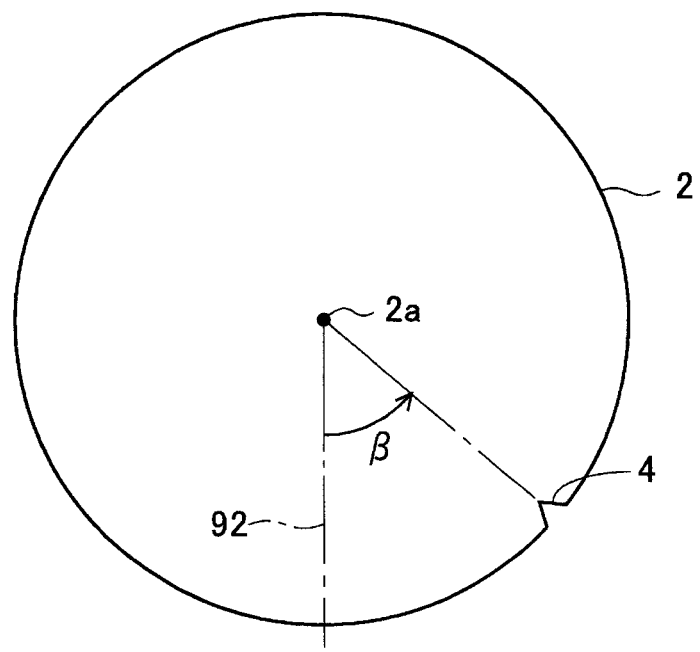
FIG. 1 is a view for explaining a twist angle of a wafer.

As already described above, when no positional deviation occurs in the wafer 2 in its circumferential direction in the course of the transfer of the wafer 2, the above-mentioned alignment angle α and the twist angle β of the wafer 2 on the platen 14 have a certain relationship decided in accordance with an apparatus structure. For example, in the present embodiment, the reference position 92 for the twist angle β, illustrated in FIG. 1, is defined as a vertical line when the wafer 2 is raised as mentioned above (i.e., a line parallel to the Z direction when the wafer 2 is horizontally placed), and the reference position 94 for the alignment angle α is also defined as a line parallel to the Z direction as illustrated in FIG. 2. Thus, upon transfer of the wafer 2 from the aligner 40 to a load lock mechanism 54a by a wafer transfer unit 42a described later, for example, the wafer 2 is rotated by 90 degrees in a clockwise direction in an X-Z plane. On the other hand, upon transfer of the wafer 2 from the load lock mechanism 54a to the platen 14 by a transfer arm 50a of a wafer transfer unit 46, the wafer 2 is rotated by 90 degrees in a counterclockwise direction in the X-Z plane. Therefore, both of the rotations are cancelled out, thus making the alignment angle α and the twist angle β equal to each other. The same goes for the case where the wafer 2 is transferred from the aligner 40 to the platen 14 via a load lock mechanism 54b by using a wafer transfer unit 42b and a transfer arm 50b of the wafer transfer unit 46.

The wafer transfer device functions to transfer the wafer 2 between the aligner 40 and the twist angle adjustment mechanism 12a (which is specifically the platen 14 thereof placed in the horizontal state) of the platen drive device 10. More specifically, in the present embodiment, the wafer transfer device includes: the first wafer transfer unit 42a that has a transfer arm 44a for holding the wafer 2, and transfers the wafer 2 between the aligner 40 and the first load lock mechanism 54a; and the second wafer transfer unit 46 that has, inside the implantation chamber 8, the transfer arm 50a for holding the wafer 2, and transfers the wafer 2 between the load lock mechanism 54a and the platen 14.

In the present embodiment, the wafer transfer unit 46 has the two transfer arms 50a and 50b inside the implantation chamber 8, and is capable of independently swiveling the transfer arms 50a and 50b in a reciprocating manner as indicated by arrows $A_1$ and $A_2$, respectively. The transfer arm 50b is located above the transfer arm 50a. Each of the transfer arms 50a and 50b is capable of holding the wafers 2 on its support part 52 on a one-by-one basis. When the wafer 2 is passed between the load lock mechanisms and the platen 14, the transfer arms 50a and 50b are each located above the platen 14 (see FIG. 3). Using the transfer arm 50a, the wafer 2 can be transferred between the load lock mechanism 54a and the platen 14. Using the transfer arm 50b, the wafer 2 can be transferred between the load lock mechanism 54b and the platen 14.

This ion implanter further includes the third wafer transfer unit 42b that has a transfer arm 44b for holding the wafer 2, and transfers the wafer 2 between the aligner 40 and the load lock mechanism 54b. This wafer transfer unit 42b and the above-mentioned wafer transfer unit 46 are also included in the wafer transfer device.

The load lock mechanisms 54a and 54b each have a structure similar to that of a load lock mechanism described in Patent Document 1 or 2, for example, and each include: a preliminary vacuum chamber adjacent to, for example, a ceiling surface of the implantation chamber 8; and a vacuum valve by which the preliminary vacuum chamber and the implantation chamber 8 and atmospheric side are partitioned (diagrammatic illustration thereof is omitted).

As described above, the ion implanter includes the two wafer transfer units 42a and 42b, the two transfer arms 50a and 50b, and the two load lock mechanisms 54a and 54b; thus, for example, the transfer of the wafer 2 can be carried out via the load lock mechanisms 54a and 54b concurrently, thereby improving throughput. However, in the present invention, it is not absolutely necessary to provide the two wafer transfer units, the two transfer arms and the two load lock mechanisms in the above-described manner.

This ion implanter further includes a light source 64, a light guide 66, light guides 70a to 70d, a camera 84, an image processing device 86, and a control device 90.

The light source 64 emits light 74, and is provided outside the implantation chamber 8. This is because since no gas-induced heat conduction and convection occur inside the implantation chamber 8, the light source 64 will be broken due to heat generated by the light source 64 itself when it is provided inside the implantation chamber 8. The light source 64 is a light-emitting diode (abbreviated as "LED"), for example, but is not limited to an LED. Alternatively, the light source 64 may be any other light source such as a lamp.

The light 74 emitted from the light source 64 is guided to the inside of the implantation chamber 8 through the light guide 66. The reference character "62" represents a feedthrough. In the present embodiment, the light 74 guided through the light guide 66 is divided into four branches by a branching part 68 inside the implantation chamber 8, and introduced into the four light guides 70a to 70d. The respective light guides 70a to 70d irradiate an outer peripheral region of the wafer 2 on the horizontal platen 14 from a bottom side of the wafer 2 with the light 74 emitted from emission parts 72a to 72d at tips of the respective light guides 70a to 70d, thereby forming light irradiation regions 76a to 76d that create silhouette (i.e., shadowgraphs or shadowgraph images) of the outer peripheral region (see FIG. 4). Note that although the four light irradiation regions 76a to 76d are formed in the present embodiment, it is not absolutely necessary to form four light irradiation regions, but at least three light irradiation regions may be formed. The reason for this will be described later.

More specifically, in the present embodiment, the ion implanter is formed to use, as a reflector, a floor surface 8a inside the implantation chamber 8 so that the light 74 emitted from the respective light guides 70a to 70d (more specifically, the light 74 emitted from the emission parts 72a to 72d of the light guides 70a to 70d [the same goes for the following description]) is reflected by the floor surface 8a, thereby forming the above-mentioned light irradiation regions 76a to 76d. Other effects and so on will be described later. The emission parts 72a to 72d of the respective light guides 70a to 70d are attached to an unillustrated stand so as to face obliquely downward.

Each of the light guide 66 and the light guides 70a to 70d are formed using a plurality of optical fibers, for example.

The light irradiation regions 76a to 76d are preferably appropriately distributed instead of being concentratedly located close to one another. This is because the appropriate distribution of the light irradiation regions 76a to 76d can more flexibly deal with various twist angles β. Examples of the light irradiation regions 76a to 76d are illustrated in FIG. 4. Assuming that the reference position 92 is 0 degree, centers of the light irradiation regions 76a to 76d are located at positions corresponding to 0 degree, 65 degrees, 180 degrees and 295 degrees, respectively, in a counterclockwise direction. However, these angles are provided by way of example only, and may be other angles.

Note that in FIGS. 2 and 3, diagrammatic illustration is simplified so that the light 74 emitted from each of the light guides 70a to 70d is indicated by a single line, but the light 74 actually expands to form the light irradiation regions 76a to 76d. The same goes for FIG. 9 described later.

A ceiling surface 8b of the implantation chamber 8 is provided, at its region located above a center of the horizontal platen 14, with a transparent window plate 82, and the camera 84 is provided outside and in the vicinity of the window plate 82. This camera 84 is capable of taking an image of the wafer 2 on the horizontal platen 14. More specifically, the camera 84 is capable of taking an image of the above-mentioned silhouette of the wafer 2 at the light irradiation regions 76a to 76d.

The camera 84 is a CCD camera, for example, but may be any other camera.

The image processing device 86 is provided outside the implantation chamber 8. This image processing device 86 has the function of processing image data supplied from the camera 84, thereby detecting a notch angle $\phi$ of the wafer 2 on the platen 14 (see FIG. 4).

Using the camera 84 and image processing device 86, a specific example of a method for detecting the notch angle $\phi$ of the wafer 2 will be described.

Figure 5:
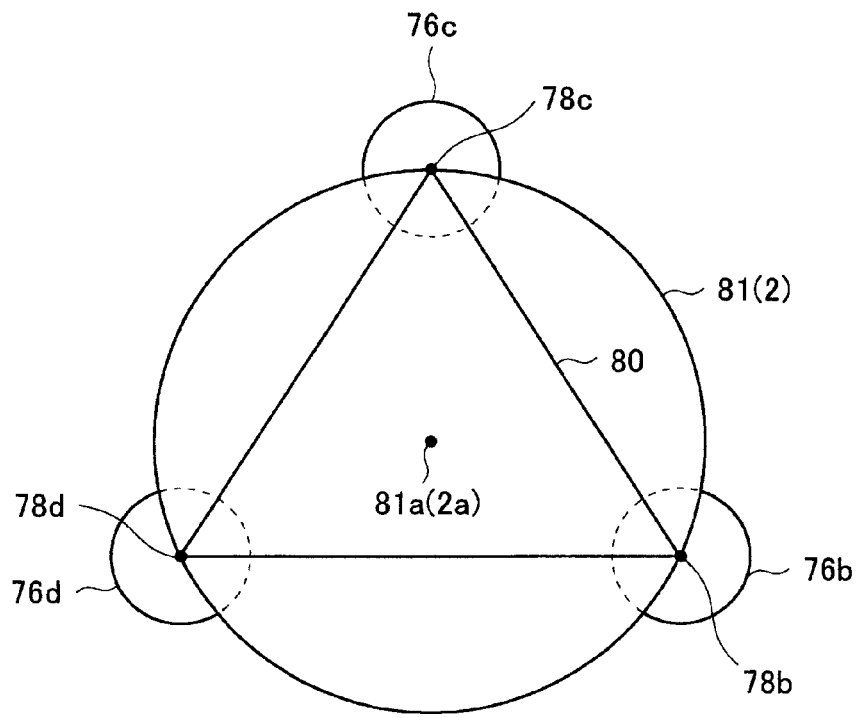
FIG. 5 is a view for explaining an example of method of detecting the center position of the wafer.

First, a center position of the wafer 2 is preferably detected. For this detection, three of the four light irradiation regions 76a to 76d are used. For example, the three light irradiation regions 76b to 76d are used as illustrated in an example presented in FIG. 5. Then, from image data of the wafer 2 obtained at these three regions, end points 78b to 78d of the three regions of the wafer 2 are detected. Specific examples of methods for detecting these end points 78b to 78d may include a method similar to a method for detecting an end point position $P_1$, which will be described later with reference to FIGS. 6 and 7, for example. When the three end points 78b to 78d are connected to each other by straight lines, a triangle 80 is provided. A circumcircle 81 of this triangle 80 is obtained, and a center 81a of the circumcircle 81 is obtained; then, this center 81a is determined as the center 2a of the wafer 2. In this manner, the actual center position of the wafer 2 can be detected.

If two end points (e.g., the end points 78b and 78d) of the wafer 2 are detected, only a straight line is obtained even when these two points are connected to each other, and therefore, the center position of the wafer 2 cannot be detected in that case. Detection of the actual center position of the wafer 2 is preferable in accurately detecting the angle $\phi$ of the notch 4. For these reasons, at least three of the light irradiation regions (76a to 76d) are formed.

Moreover, the angle $\phi$ of the notch 4 with respect to a line (i.e., the reference position 92) passing through the center 2a will be detected as follows. Specifically, using image data of the light irradiation region (e.g., the light irradiation region 76b) at which the notch 4 is located due to adjustment of the alignment angle $\alpha$, a rate of change in brightness in the vicinity of an end of the wafer 2 is detected. This is because since the wafer 2 is normally opaque or translucent, it is dark at a position where the wafer 2 exists, and a bright image is obtained at a position other than the wafer 2. Further, at given intervals along an outer periphery of the wafer 2, a rate of change in brightness in a radial direction from the periphery of the wafer 2 toward its center is detected.

Figure 6:
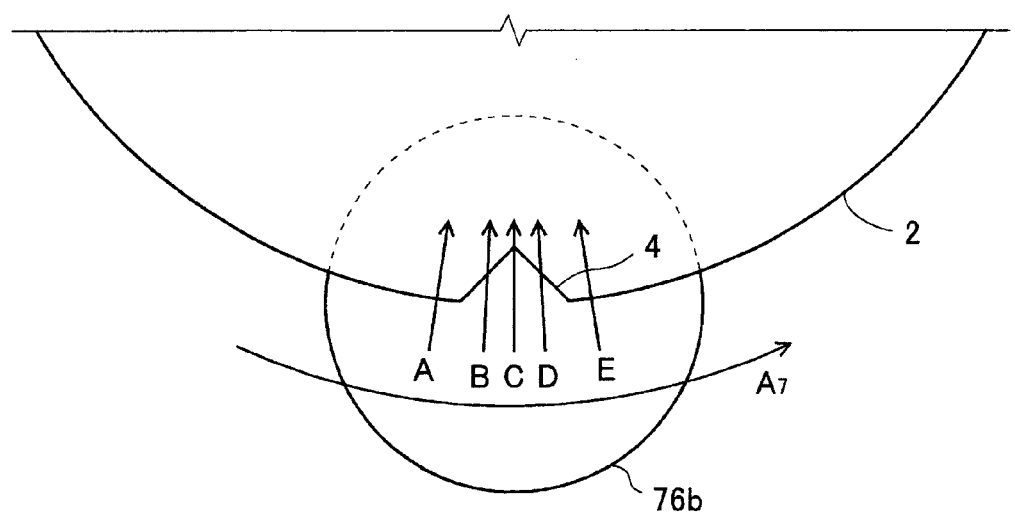
FIG. 6 is a view for explaining an example of a method of detecting a notch position of the wafer.
Figure 7A:
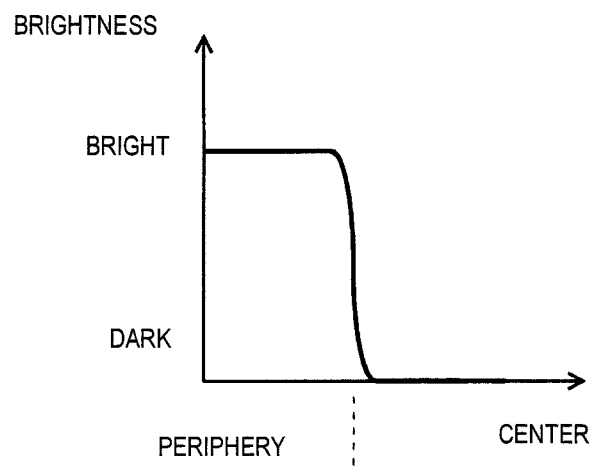
FIGS. 7A and 7B are views showing an example of change of brightness and a rate of change of brightness at an edge region of the wafer.
Figure 7B:
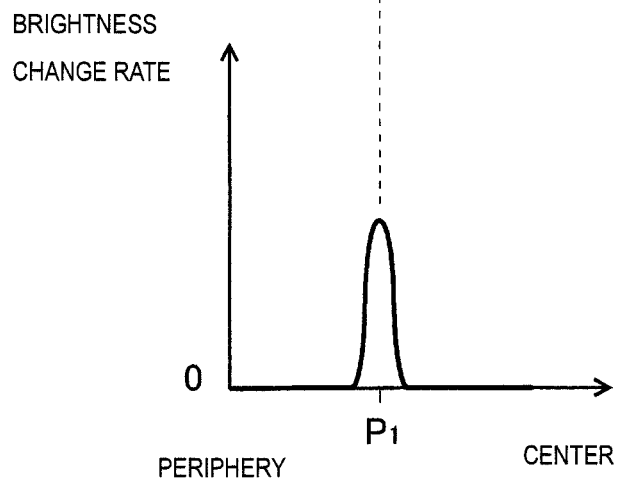
Figure 8A:
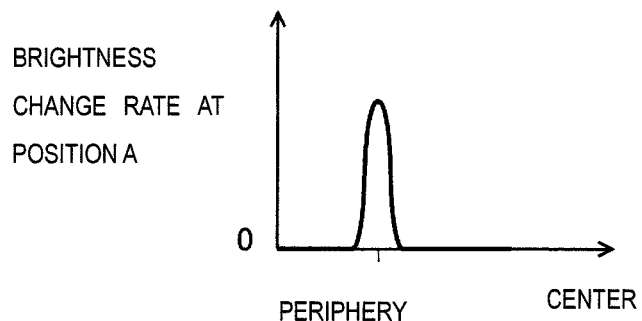
FIGS. 8A-8E are views showing examples of rates of change of brightness at the edge region in the notch of the wafer as shown in FIG. 6.
Figure 8B:
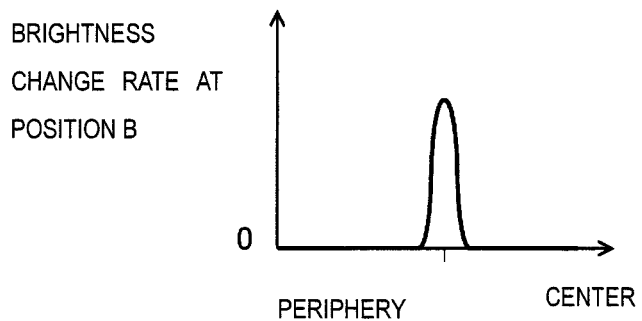
Figure 8C:
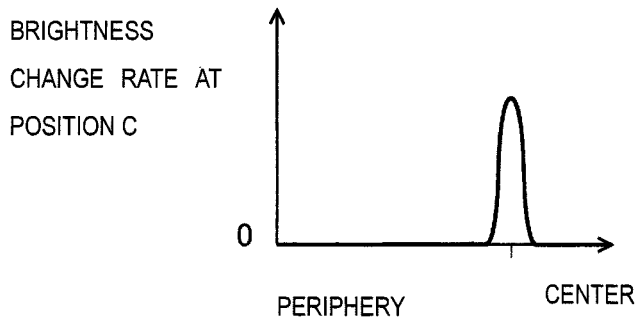
Figure 8D:
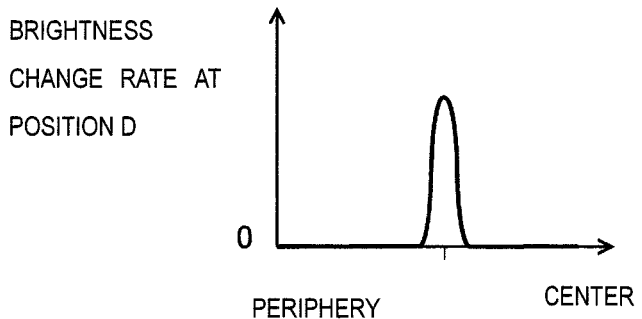
Figure 8E:
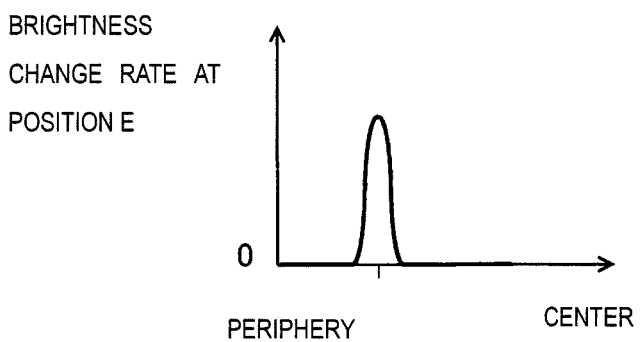

For example, with respect to a point A illustrated in FIG. 6, the brightness and the rate of change thereof in a radial direction from the periphery of the wafer 2 toward its center exhibit values as those illustrated in FIGS. 7A and 7B, and a peak position $P_1$ of the rate of change is located at an end point (edge) of the wafer 2. Note that in FIG. 6, the light irradiation region 76b illustrated in FIG. 4 is located at a lower position for the sake of clarity.

The above-described measurements are carried out at given intervals along the outer periphery of the wafer 2 in a direction indicated by an arrow $A_7$. The measurements are carried out at positions A to E . . . , for example. Examples of the brightness change rates at these positions A to E are illustrated in FIGS. 8A to 8E. Since the notch 4 has a substantially triangle shape, measurement results as those in FIGS. 8A to 8E are obtained. Furthermore, comparisons are made on these measurement results to determine a position (the position C in this example) at which the peak of the change rate is closest to the center of the wafer 2, and an angle of this position C with respect to the reference position 92 is determined as the angle $\phi$ of the notch 4. In this manner, the actual angle $\phi$ of the notch 4 can be detected.

It is to be noted that the above-described detection method is provided by way of example, and any other detection method may be used. For example, a known technique such as one described in Japanese Unexamined Patent Application Publication No. 10-38539 may be used to process image data of the light irradiation region 76b and to obtain coordinates of the notch 4, thereby detecting the actual angle $\phi$ of the notch 4.

The control device 90 has the function of controlling the platen drive device 10, the aligner 40, the wafer transfer units 42a and 42b, the wafer transfer unit 46, the image processing device 86, etc. Detailed description will be made about this later.

A wafer handling method according to a first embodiment which is carried out in the ion implanter of the first embodiment will be described mainly with reference to FIGS. 2 to 4.

First, an alignment step for adjusting the alignment angle $\alpha$ by rotating the wafer 2 is carried out using the aligner 40 so that the notch 4 of the wafer 2 is located within one of the four light irradiation regions 76a to 76d when the wafer 2 is conveyed to the twist angle adjustment mechanism 12a (more specifically, the platen 14 thereof). In this case, the alignment angle $\alpha$ is preferably adjusted so that the notch 4 of the wafer 2 is located within the light irradiation region closest to the target twist angle $\beta$ given as one of ion implantation conditions to this ion implanter, and therefore, the alignment angle $\alpha$ is adjusted in the above-described manner. The reason for this will be described later. The ion implantation condition is referred to as a "recipe" in the present technical field, and will be given to, for example, the control device 90 from outside.

A specific example of the angle is described below. For example, when the target twist angle $\beta$ given as one of the ion implantation conditions is 50 degrees, the light irradiation region 76b, the center of which is located at an angle of 65 degrees, is the closest light irradiation region as illustrated in the example presented in FIG. 4. Therefore, the alignment angle $\alpha$ is adjusted using the aligner 40 so that the notch 4 is located within this light irradiation region 76b. For example, the alignment angle $\alpha$ is adjusted to 65 degrees.

Subsequently, for example, the wafer transfer unit 42a and the wafer transfer unit 46 carry out a transfer step for transferring the wafer 2 from the aligner 40 to the twist angle adjustment mechanism 12a (more specifically, the platen 14 thereof) via the load lock mechanism 54a in the present embodiment.

Next, a twist step is carried out as follows. Using the camera 84 and the image processing device 86, the angle $\phi$ of the notch 4 of the wafer 2 on the twist angle adjustment mechanism 12a is detected by the above-described method. A second difference between the alignment angle α and the target twist angle β given as one of the ion implantation conditions is factored into a first difference between the angle φ of the notch 4 and the alignment angle α, thereby obtaining an angle. Then, the wafer 2 is rotated by the obtained angle by the twist angle adjustment mechanism 12a so that the angle φ of the notch 4 of the wafer 2 on the twist angle adjustment mechanism 12a (more specifically, the platen 14 thereof) coincides with the target twist angle β given as one of the ion implantation conditions.

For example, assuming that the alignment angle α is 65 degrees and the target twist angle β given as one of the ion implantation conditions is 50 degrees as described in the example, the second difference is 15 degrees. When the counterclockwise direction is represented by a "+" symbol and the clockwise direction is represented by a "−" symbol, the second difference is represented as +15 degrees.

Further, if a positional deviation of +2 degrees, for example, has occurred in the wafer 2 in its circumferential direction due to some kind of cause (such as vibration created at the time of conveyance of the wafer 2, for example) in the course of the transfer of the wafer 2 in the transfer step, the first difference is +2 degrees.

Accordingly, in this example, the sum of the first and second differences is +17 degrees, and therefore, the wafer 2 is rotated by −17 degrees in the twist step. Thus, the twist angle β of the wafer 2 on the twist angle adjustment mechanism 12a can be accurately adjusted to 50 degrees that is the target twist angle given as one of the ion implantation conditions Note that when the wafer 2 is rotated by −17 degrees as described above, the following operation (a) or (b) may be performed. In the operation (a), the wafer 2 is rotated by −17 degrees at a stroke. In the operation (b), the wafer 2 is first rotated by −2 degrees to correct the first difference, and is then rotated by −15 degrees for the second difference.

In the wafer handling method according to the first embodiment, even if a positional deviation has occurred in the wafer 2 in its circumferential direction in the course of the transfer of the wafer 2, this positional deviation is detected as the first difference between the angle φ of the notch 4 of the wafer 2 on the twist angle adjustment mechanism 12a and the alignment angle α. Then, the twist angle β is adjusted by rotating the wafer 2 in consideration of this first difference, and therefore, the twist angle β of the wafer 2 can be accurately adjusted to the target twist angle given as one of the ion implantation conditions.

Besides, since the alignment step is carried out, there is no need to irradiate the entire perimeter of the wafer 2 with light. As already mentioned above, at least three of the light irradiation regions (76a to 76d) may be formed. Accordingly, the structure of means for irradiating the wafer 2 with light is facilitated and simplified. In particular, if an attempt is made to irradiate the entire perimeter of the wafer 2 with light from its bottom side when the platen 14 and the wafer 2 held thereon are brought not only to the horizontal state but also to the raised state as in this ion implanter, an annular light-emitting device has to be provided for this irradiation; however, this light-emitting device will abut against the wafer 2 when the wafer 2 is brought to the raised state, and therefore, it is difficult to realize this irradiation. To the contrary, in this wafer handling method, there is no need to irradiate the entire perimeter of the wafer 2 with light as mentioned above, thus facilitating and simplifying the structure of means for irradiating the wafer 2 with light.

Furthermore, as in the present embodiment, when the alignment angle α is adjusted in the alignment step so that the notch 4 of the wafer 2 is located within the light irradiation region 76b closest to the target twist angle β given as one of the ion implantation conditions, the second difference between the alignment angle α and the target twist angle β given as one of ion implantation conditions can be reduced. For example, when the target twist angle β given as one of ion implantation conditions is 50 degrees as in the example, the alignment angle α may be adjusted so that the notch 4 of the wafer 2 is located, for example, within the light irradiation region 76c (e.g., at 180 degrees) in the alignment step, but in that case, the second difference between the alignment angle α and the target twist angle β given as one of ion implantation conditions is +130 degrees. However, the second difference in the present embodiment can be made smaller than the second difference in the above-mentioned case (note that the second difference is +15 degrees in the example of the present embodiment). As a result, the angle at which the wafer 2 is rotated in the twist step can be reduced, thus making it possible to reduce time required for the twist angle adjustment.

When ion implantation is performed after the twist step, the platen 14 and the wafer 2 are each brought to the raised state, and the wafer 2 is irradiated with the ion beam 6, thereby performing ion implantation.

In the present embodiment, the control device 90 has the function of performing control corresponding to the alignment step, the transfer step and the twist step. Specifically, as one of the ion implantation conditions, the target twist angle β given as one of ion implantation conditions is given to the control device 90 from outside. Further, the control device 90 has the function of controlling the platen drive device 10, the aligner 40, the wafer transfer device (including the wafer transfer units 42a, 42b and 46) and the image processing device 86, thereby performing alignment control (a), transfer control (b) and twist control (c). In the alignment control (a), the wafer 2 is rotated to adjust the alignment angle α using the aligner 40 so that the notch 4 of the wafer 2 is located within one of the light irradiation regions 76a to 76d upon conveyance of the wafer 2 to the twist angle adjustment mechanism 12a (more specifically, the platen 14 thereof [the same goes for the following description]). In the transfer control (b), after the alignment control, the wafer 2 is transferred from the aligner 40 to the twist angle adjustment mechanism 12a of the platen drive device 10 by the wafer transfer device. And in the twist control (c), after the transfer control, the angle φ of the notch 4 of the wafer 2 on the twist angle adjustment mechanism 12a is detected in cooperation with the image processing device 86, and the second difference between the alignment angle α and the target twist angle β given as one of the ion implantation conditions is factored into the first difference between the notch angle φ and the alignment angle α, thereby obtaining an angle. Then, the wafer 2 is rotated by the obtained angle by the twist angle adjustment mechanism 12a so that the angle φ of the notch 4 of the wafer 2 on the twist angle adjustment mechanism 12a coincides with the target twist angle β given as one of the ion implantation conditions.

Moreover, in the present embodiment, the control device 90 adjusts the alignment angle α in the alignment control so that the notch 4 of the wafer 2 is located within the light irradiation region (e.g., the light irradiation region 76b) closest to the target twist angle β given as one of the ion implantation conditions.

Accordingly, the ion implanter including the above-described control device 90 is capable of achieving effects similar to those described on the wafer handling method according to the first embodiment.

Note that the light irradiation regions 76a to 76d may be formed by applying the light 74, emitted from the respective light guides 70a to 70d, to the outer peripheral region of the wafer 2 from its bottom side directly (i.e., without reflecting the light 74 by the reflector); however, the light irradiation regions 76a to 76d are preferably formed by reflecting the light 74 by the reflector inside the implantation chamber 8 as in the present embodiment.

For example, the reflector may be the floor surface 8a inside the implantation chamber 8 as in the present embodiment, may be a wall surface other than the floor surface 8a inside the implantation chamber 8, may be a reflecting plate provided inside the implantation chamber 8, or may be a combination thereof.

The light 74 emitted from the light guides 70a to 70d is reflected by the reflector to form the light irradiation regions 76a to 76d, thereby making it possible to widen the light 74 emitted from the light guides 70a to 70d, and to widen the respective light irradiation regions 76a to 76d. This is because the reflection of the light 74 by the reflector increases the distance between the tips of the light guides 70a to 70d (i.e., the emission parts 72a to 72d) and the wafer 2, and widens the light 74 therebetween. Further, when the reflector has the property of scattering the light 74, the respective light irradiation regions 76a to 76d can be widened also by this scattering action. As a result, the range of options for the alignment angle α in the alignment step is extended, thus further facilitating the adjustment of the alignment angle α.

Besides, when the light with which the outer peripheral region of the wafer 2 is irradiated is excessively intense, a concave image similar to the notch 4 appears due to a diffraction phenomenon of the light, and this image might be erroneously detected as the notch 4; nevertheless, when the light is simply reduced in intensity, the light irradiation regions 76a to 76d are narrowed. To cope with this dilemma, the light is reflected by the reflector, and the brightness of the light irradiation regions 76a to 76d is thus moderately reduced, thereby making it possible to obtain both of: the effect of preventing erroneous detection caused by the above-mentioned diffraction phenomenon of the light; and the effect of widening the respective light irradiation regions 76a to 76d.

Furthermore, the light 74 is reflected by the reflector so as to be indirect light, thereby making it possible to reduce nonuniformity in brightness of the respective light irradiation regions 76a to 76d, and to uniformize the brightness thereof; hence, also in this viewpoint, the detection of the notch 4 is facilitated. When the reflector has the property of scattering the light 74 as described above, the effect of uniformizing the brightness is further enhanced.

More specific examples of the reflector include a stainless steel plate (abbreviated as "SUS"), for example. Usually, a stainless steel plate also has the property of scattering the light 74, and is thus capable of achieving the above-mentioned effects.

(Second and Third Embodiments)

Figure 9:
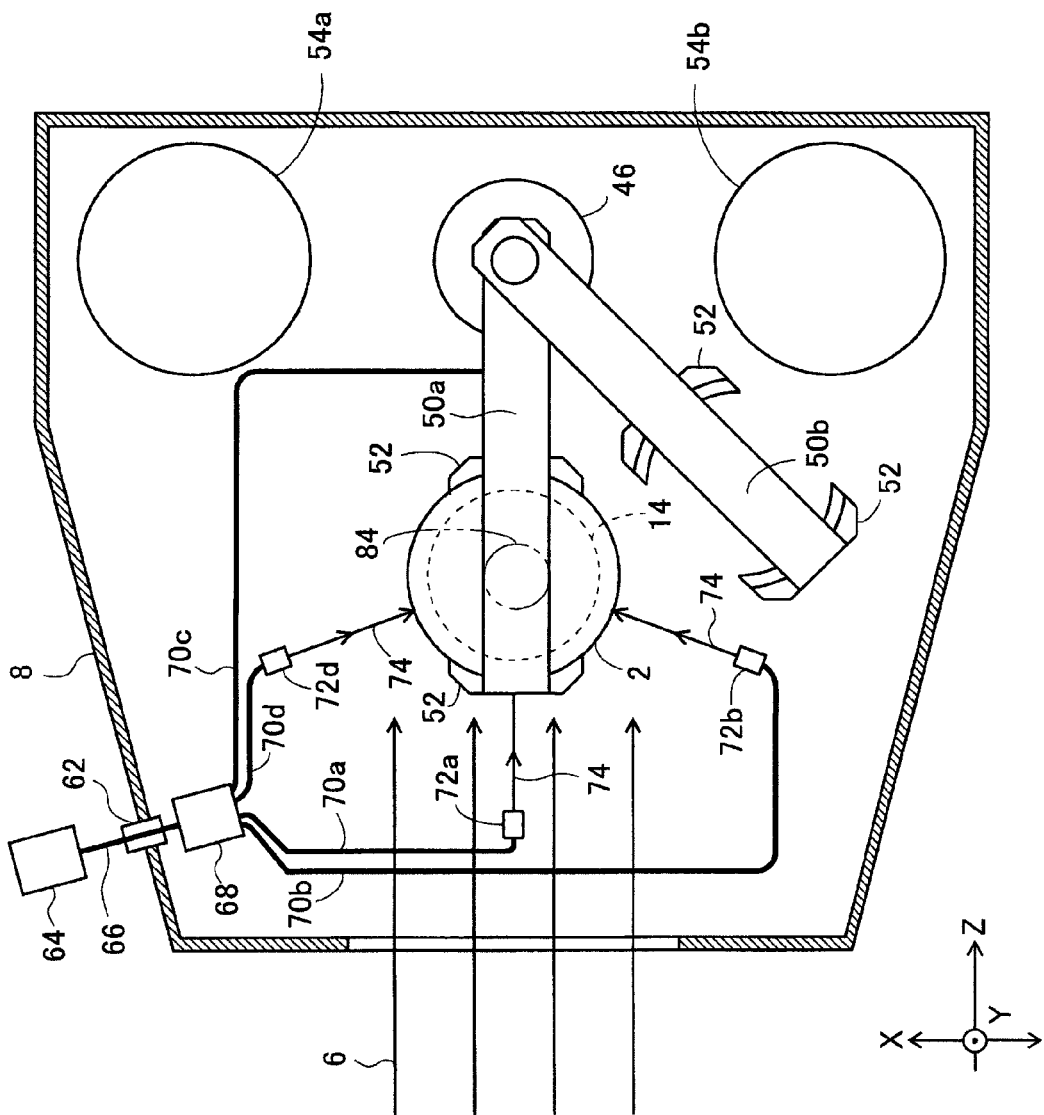
FIG. 9 is a view showing partially an ion implanter according to a second embodiment.

In FIG. 9, there is illustrated an ion implanter of second and third embodiments for carrying out a wafer handling method of second and third embodiments according to the present invention.

The same reference numerals as those of the reference numerals used in the first embodiment are affixed to the remaining structures, and their detailed explanation will be omitted herein.

First, the following description will be made with attention focused on the transfer arm 50a of the wafer transfer unit 46 by way of example.

In the ion implanter, even when the wafer 2 is held above the twist angle adjustment mechanism 12a (more specifically, the platen 14 thereof) by the transfer arm 50a of the wafer transfer unit 46 as illustrated in an example presented in FIG. 9, the two of the light irradiation regions are formed by the light 74, emitted from the light guides 70b and 70d, without being interfered with by the transfer arm 50a and the support part 52 thereof. More specifically, the light irradiation regions 76b and 76d illustrated in FIG. 4 are formed.

In this case, the image processing device 86 may further have the functions of detecting the center position of the wafer 2 on the transfer arm 50a and detecting a radial positional deviation of this center position from a reference position by using: image data of the light irradiation regions 76b and 76d, provided from the camera 84; and end point position data (which will hereinafter be referred to as virtual data) of a single position of the wafer 2 on the transfer arm 50a, which has been stored in advance in the image processing device 86, for example.

When at least two of the light irradiation regions exist, at least two end point positions of the wafer 2 on the transfer arm 50a can be measured and detected by the method that has already been described with reference to FIGS. 6 and 7, for example. In addition, with the use of the above-mentioned virtual data of the single position, at least three end point positions are found, and therefore, the position of the center 2a of the wafer 2 on the transfer arm 50a can be detected by the method that has already been described with reference to FIG. 5, for example. Moreover, a comparison is made between the detected center position and the reference position determined in advance, thereby making it possible to detect the radial positional deviation of the detected center position from the reference position. The image processing device 86 further has the function of performing such detection.

Note that in order to obtain the virtual data, an image of the wafer 2 properly held on the transfer arm 50a in the past may be taken by the camera 84, and end point position data of a single position of this wafer 2 may be stored as the virtual data in a storage unit of the image processing device 86, for example.

Furthermore, in the wafer handling method according to the second embodiment, with the wafer 2 held above the twist angle adjustment mechanism 12a (more specifically, the platen 14 thereof) by the transfer arm 50a, a positional deviation detection step for detecting the radial positional deviation of the wafer 2 is carried out using the image processing device 86.

Thus, the positional deviation of the wafer 2 on the transfer arm 50a can be detected. Further, the detection result is used to take an action such as suspension of the transfer of the wafer 2, for example, and thus can serve to prevent abnormal transfer of the wafer 2, ion implantation failure, etc. from occurring. Besides, structure simplification can be achieved since the detection can be carried out by utilizing the light source 64, the light guides 66, 70b and 70d, the camera 84, the image processing device 86, etc., which are provided in order to accurately adjust the twist angle β of the wafer 2.

Note that when the virtual data of the single position is used, the accuracy of detection of the center position of the wafer 2 on the transfer arm 50a might be slightly reduced as compared with an after-mentioned embodiment in which actual measurement data of three positions is used; however, the positional deviation of the wafer 2 can still be detected. In terms of prevention of occurrence of abnormal transfer of the wafer 2, for example, even the above-mentioned accuracy is sufficiently useful in many cases.

Figure 10:
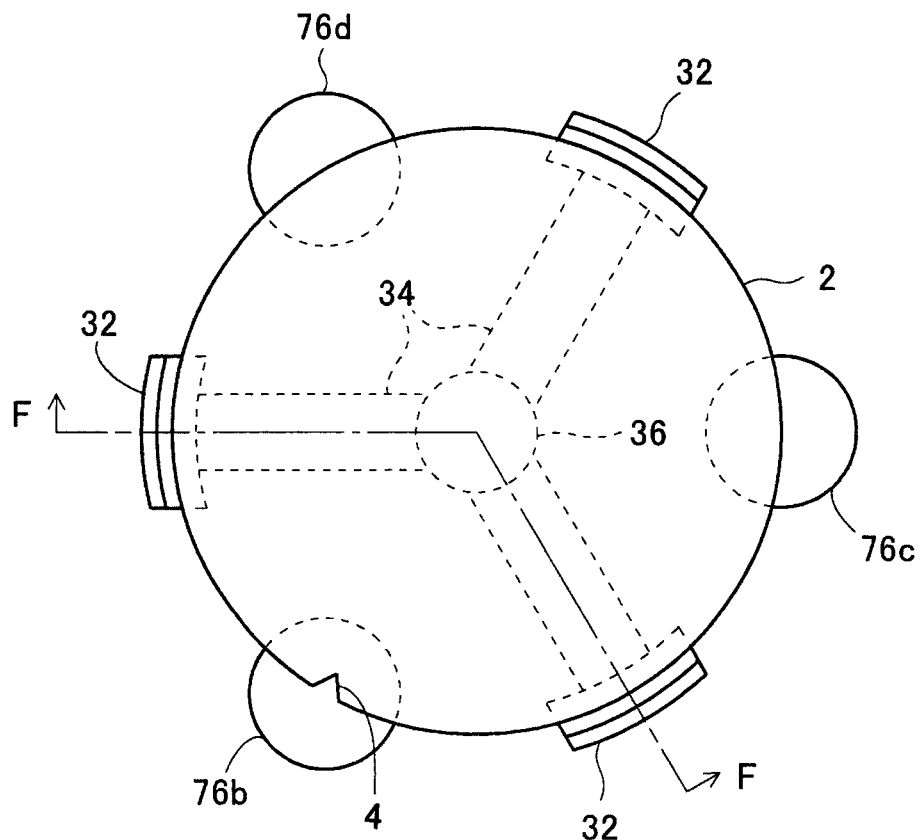
FIG. 10 is a plane view showing another example of a twist angle adjustment mechanism.
Figure 11:
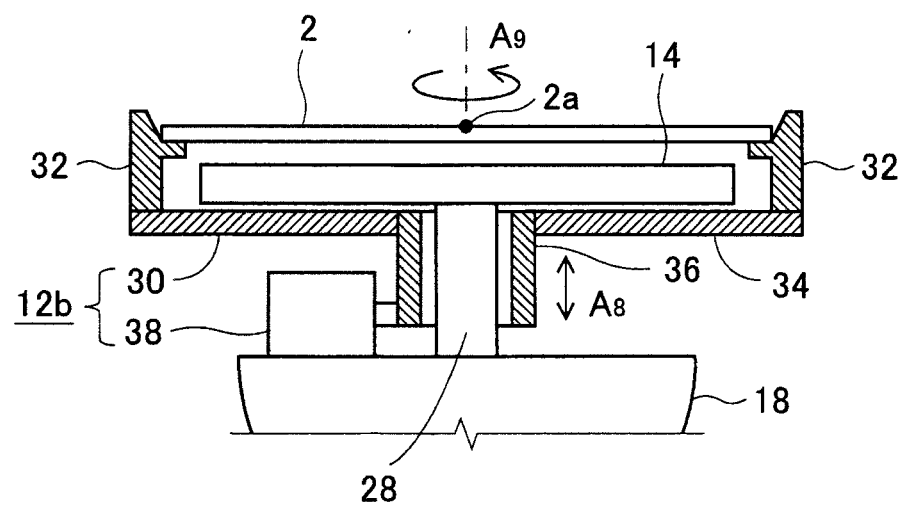
FIG. 11 is a schematic cross section view along a line F-F in FIG. 10.

For example, the positional deviation detection step may be carried out at least at either a time point before the wafer 2 is passed to the twist angle adjustment mechanism 12a from the transfer arm 50a or a time point after the wafer 2 has been passed to the transfer arm 50a from the twist angle adjustment mechanism 12a. Further, although the above description has been made with attention focused on the transfer arm 50a of the wafer transfer unit 46, the same holds true for the case where the transfer arm 50b is used instead of the transfer arm 50a. Also, the same holds true for the third embodiment described later. Furthermore, also when the after-mentioned twist angle adjustment mechanism 12b (see FIGS. 10 and 11) is employed, the above-described positional deviation detection may be carried out at least at either a time point before the wafer 2 is passed to the twist angle adjustment mechanism 12b from the transfer arm or a time point after the wafer 2 has been passed to the transfer arm from the twist angle adjustment mechanism 12b.

In the second embodiment, the control device 90 further has the function of performing control corresponding to the positional deviation detection step. Specifically, the control device 90 further has the function of carrying out positional deviation detection control for detecting a radial positional deviation of the wafer 2 in cooperation with the image processing device 86, with the wafer 2 held above the twist angle adjustment mechanism 12a by the transfer arm 50a or 50b.

Accordingly, the ion implanter including the above-described control device 90 is capable of achieving effects similar to those described on the wafer handling method according to the second embodiment.

Arrangement of the light guides 70a to 70d and/or structures of the transfer arms 50a and 50b and the support parts 52 thereof, for example, may be appropriately changed. For instance, a notch through which the light 74 passes through may be provided at the transfer arms 50a and 50b and/or the support parts 52, and the wafer 2 may be held above the twist angle adjustment mechanism 12a by the transfer arm 50a or 50b. Even in such a state, at least three of the light irradiation regions (76a to 76d) may be formed by the light 74 emitted from the light guides 70a to 70d. In this embodiment, actual measurement data of at least three positions are used. The method described above is the wafer handling method according to the third embodiment.

In the present embodiment, the image processing device 86 may further have the functions of detecting the center position of the wafer 2 on the transfer arm 50a or 50b and detecting a radial positional deviation of this center position from the reference position by using image data of at least three of the light irradiation regions, which is provided from the camera 84. An example of a method for detecting the center position of the wafer 2 and its positional deviation by using data of at least three positions is similar to that of the method of the second embodiment in which the actual measurement data of at least two positions and virtual data of a single position are used, and therefore, redundant description thereof will be omitted.

Furthermore, also in the wafer handling method according to the third embodiment, with the wafer 2 held above the twist angle adjustment mechanism 12a by the transfer arm 50a or 50b, a positional deviation detection step for detecting the radial positional deviation of the wafer 2 is carried out using the image processing device 86.

Also in the third embodiment, effects similar to those achieved by the second embodiment can be achieved. More specifically, since the actual measurement data of three positions is used, the accuracy of detection of the center position of the wafer 2 on the transfer arm 50a or 50b can be expected to be further increased in the third embodiment as mentioned above.

The control device 90 may further have the function of performing control corresponding to the positional deviation detection step of the wafer handling method according to the third embodiment. Specifically, the control device 90 may further have the function of carrying out positional deviation detection control for detecting a radial positional deviation of the wafer 2 in cooperation with the image processing device 86, with the wafer 2 held above the twist angle adjustment mechanism 12a by the transfer arm 50a or 50b.

The ion implanter including the above-described control device 90 is capable of achieving effects similar to those described on the wafer handling method according to the third embodiment.

(Another Example of Twist Angle Adjustment Mechanism)

Instead of the twist angle adjustment mechanism 12a, a twist angle adjustment mechanism for adjusting the twist angle β by rotating the wafer 2 that is yet to be held on the platen 14 may be employed. An example of such a twist angle adjustment mechanism 12b will be described below with reference to FIGS. 10 and 11.

In this example, the platen 14 is attached to the above-mentioned tilt rotation mechanism 18 via a shaft 28. This platen 14 is formed so as not to be rotated (rotated around its center) in this example, but may alternatively be formed so as to be rotated.

This twist angle adjustment mechanism 12b includes: a lift member 30 for supporting, at a plurality of positions, a peripheral edge region of the wafer 2 above the platen 14; and a lifting and lowering rotation mechanism 38 having the function of lifting and lowering the lift member 30 as indicated by an arrow $A_8$, and the function of rotating the lift member 30 and the wafer 2 held thereon around the center 2a of the wafer 2 in a direction indicated by an arrow $A_9$ (or in a direction opposite thereto). The lifting and lowering rotation mechanism 38 is attached to the tilt rotation mechanism 18. Accordingly, also this twist angle adjustment mechanism 12b can be brought to a horizontal state for passing of the wafer 2, for example, and to a raised state for ion implantation to the wafer 2 by the tilt rotation mechanism 18.

When the wafer 2 is passed to/from the wafer transfer device (e.g., the above-mentioned wafer transfer unit 46) and when the wafer 2 is rotated, the lift member 30 is lifted to separate the wafer 2 and the platen 14 from each other (which is a state illustrated in FIG. 11), and when the wafer 2 is held on the platen 14, the lift member 30 is lowered to place the wafer 2 on the platen 14. The twist angle β of the wafer 2 can be adjusted by rotating the lift member 30 and the wafer 2 each located at a lifted position.

Note that the lifting and lowering rotation mechanism 38 may be divided into: a lifting and lowering mechanism for lifting and lowering the lift member 30 as described above; and a rotation mechanism for rotating the lift member 30 as described above.

In this example, the lift member 30 includes: a plurality of support parts 32 (e.g., three support pars 32 in this example) for supporting the peripheral edge region of the wafer 2; a radial arm part 34 for supporting these support parts 32; and a cylindrical part 36 for supporting this arm part 34. It is to be noted that this structure is provided by way of example, and the lift member 30 is not limited to this structure.

The support parts 32 may be arranged and a distance by which the wafer 2 is separated from the platen 14 may be set so that the support parts 32 and wafer 2 and platen 14, and the wafer transfer unit (more specifically, the transfer arm thereof) will not abut against each other (or mechanically interfere with each other).

Also when this twist angle adjustment mechanism 12b is used, at least three of the light irradiation regions can be formed at an outer peripheral region of the wafer 2. For example, as illustrated in the example presented in FIG. 10, the three light irradiation regions 76b to 76d can be formed (see FIGS. 2 to 4 and description thereof). When a few changes are made to the structure of the twist angle adjustment mechanism 12b, the four light irradiation regions 76a to 76d may be formed.

Accordingly, similarly to the case where the twist angle adjustment mechanism 12a is used, the transfer step, the twist step, etc. are carried out, so that the twist angle β of the wafer 2 can be accurately adjusted to the target twist angle given as one of the ion implantation conditions.

Moreover, even in a state where the wafer 2 is held above the twist angle adjustment mechanism 12b by the transfer arm (e.g., the transfer arm 50a or 50b) of the wafer transfer unit, at least two of the light irradiation regions (e.g., the light irradiation regions 76b and 76d) can be formed. Accordingly, similarly to the case where the twist angle adjustment mechanism 12a is used, the above-described positional deviation detection step, in which the actual measurement data of two positions and the virtual data of a single position are used, is carried out, so that a radial positional deviation of the wafer 2 on the transfer arm can be detected.

Further, arrangement of the light guides 70a to 70d and/or structures or the like of the transfer arms may be appropriately changed, and the wafer 2 may be held above the twist angle adjustment mechanism 12b by the transfer arm. Even in such a state, at least three of the light irradiation regions may be formed. Also in this case, similarly to the case where the twist angle adjustment mechanism 12a is used, the positional deviation detection step, in which the actual measurement data of three positions is used, is carried out, so that a radial positional deviation of the wafer 2 on the transfer arm can be detected.

When the above-described twist angle adjustment mechanism 12b is employed, the control device 90 has the function of controlling this twist angle adjustment mechanism 12b instead of controlling the twist angle adjustment mechanism 12a, thereby carrying out the twist control. Naturally, the control device 90 also has the function of carrying out the alignment control and transfer control. In addition, the control device 90 may further have the function of carrying out the positional deviation detection control.

What is claimed is:

1. A wafer handling method performed in an ion implanter including a platen configured to hold a wafer having a notch on an outer peripheral region thereof, a twist angle adjustment mechanism configured to adjust a twist angle, which is an angle of the notch of the wafer with respect to a first reference position and an aligner configured to adjust an alignment angle, which is an angle of the notch of the wafer with respect to a second reference position, the method comprising:
    adjusting an alignment angle while rotating the wafer by the aligner;
    transferring, after adjusting the alignment angle, the wafer from the aligner to a twist angle adjustment mechanism that is disposed inside an ion implantation chamber of the ion implanter, wherein the twist angle adjustment mechanism comprises the platen and the platen is configured to hold the wafer during ion implantation;
    irradiating at least three portions on the outer peripheral region of the wafer on the twist angle adjustment mechanism with a light from a first side of the wafer without irradiating an entirety of the outer peripheral region of the wafer, after transferring the wafer;
    taking an image of the wafer on the twist angle adjustment mechanism from a second side of the wafer;
    detecting the twist angle of the wafer on the twist angle adjustment mechanism based on the image of the wafer; and
    performing a twist control in which the wafer is rotated by the twist angle adjustment mechanism by an angle obtained from a first difference between the detected twist angle and the alignment angle and a second difference between the alignment angle and a target twist angle given as one of ion implantation conditions.

2. The wafer handling method according to claim 1, wherein the at least three portions of the outer peripheral region of the wafer on the twist angle adjustment mechanism irradiated with the light form at least three light irradiation regions, and
wherein the alignment angle is adjusted so that the notch of the wafer on the twist angle adjustment mechanism is located within one of the light irradiation regions when the twist control is performed.

3. The wafer handling method according to claim 2, wherein the alignment angle is adjusted so that the notch of the wafer is located within the light irradiation region closest to the target twist angle.

4. The wafer handling method according to claim 1, wherein the wafer is transferred from the aligner to the twist angle adjustment mechanism by a transfer arm, wherein at least three portions of the outer peripheral region of the wafer are irradiated with the light and the image of the wafer is taken in at least three light irradiation regions, with the wafer held above the twist angle adjustment mechanism by the transfer arm, and
wherein the wafer handling method comprises:
    detecting a center position of the wafer on the transfer arm based on the image of the wafer of the at least three light irradiation regions and detecting a radial positional deviation of the center position from a reference position.

5. The wafer handling method according to claim 1, wherein the wafer is transferred from the aligner to the twist angle adjustment mechanism by a transfer arm, wherein at least two portions of the outer peripheral region of the wafer are irradiated with the light and the image of the wafer is taken in at least two light irradiation regions, with the wafer held above the twist angle adjustment mechanism by the transfer arm, and
wherein the wafer handling method comprises:
    detecting a center position of the wafer on the transfer arm and detecting a radial positional deviation of the center position from a reference position based on the image of the wafer of the at least two light irradiation regions and end point position data of a single position of the wafer on the transfer arm, which has been stored in advance.

6. The wafer handling method according to claim 1, wherein the three portions on the outer peripheral region of the wafer on the twist angle adjustment mechanism are irradiated with light reflected by a reflector.

7. The wafer handling method according to claim 1, wherein the at least three portions on the outer peripheral region of the wafer are irradiated by at least three emission parts.

8. The wafer handling method according to claim 1, wherein at most four portions on the outer peripheral region of the wafer are irradiated.

9. An ion implanter in which ion implantation is performed by irradiating a wafer having a notch on an outer peripheral region thereof by an ion beam, comprising:

a twist angle adjustment mechanism that is disposed inside an ion implantation chamber of the ion implanter, wherein the twist angle adjustment mechanism comprises a platen and the platen is configured to hold the wafer during ion implantation and configured to adjust a twist angle, which is an angle of the notch of the wafer with respect to a first reference position, by rotating the wafer;

an aligner configured to adjust an alignment angle, which is an angle of the notch of the wafer with respect to a second reference position, by rotating the wafer;

a wafer transfer device configured to transfer the wafer between the aligner and the twist angle adjustment mechanism;

a light source section configured to irradiate at least three portions on the outer peripheral region of the wafer on the twist angle adjustment mechanism with a light from a first side of the wafer without irradiating an entirety of the outer peripheral region of the wafer;

a camera configured to take an image of the wafer on the twist angle adjustment mechanism from a second side of the wafer;

an image processing device configured to process image data supplied from the camera to detect the twist angle of the wafer on the twist angle adjustment mechanism; and a control device configured to carry out a twist control in which the wafer is rotated by the twist angle adjustment mechanism by an angle obtained from a first difference between the detected twist angle and the alignment angle and a second difference between the alignment angle and a target twist angle given as one of ion implantation conditions.

10. The ion implanter according to claim 9, further comprising:

a platen drive device having a mechanism configured to bring the platen to a horizontal state and a raised state, and a mechanism configured to mechanically scanning the platen in a direction intersecting the ion beam.

11. The ion implanter according to claim 9, wherein the light source section includes a light source configured to emit light, and a light guide configured to guide the light emitted from the light source and irradiate the at least three portions of the outer peripheral region of the wafer on the twist angle adjustment mechanism with the light, thereby forming at least three light irradiation regions.

12. The ion implanter according to claim 11, wherein the control device is configured to carry out an alignment control in which the alignment angle is adjusted using the aligner so that the notch of the wafer on the twist angle adjustment mechanism is located within one of the light irradiation regions when the twist control is carried out.

13. The ion implanter according to claim 12, wherein in the alignment control, the control device is configured to adjust the alignment angle so that the notch of the wafer is located within the light irradiation region closest to the target twist angle.

14. The ion implanter according to claim 11, wherein the light source section includes a reflector configured to reflect the light emitted from the light guide, thereby forming the light irradiation regions.

15. The ion implanter according to claim 9, wherein the wafer transfer device comprises a transfer arm configured to hold and transfer the wafer, wherein the light source section is configured to irradiate at least three portions of the outer peripheral region of the wafer with the light, with the wafer held above the twist angle adjustment mechanism by the transfer arm, and the camera is configured to take the image of the wafer in at least three light irradiation regions, and wherein the image processing device is configured to detect a center position of the wafer on the transfer arm by using image data of the at least three light irradiation regions supplied from the camera and to detect a radial positional deviation of the center position from a reference position.

16. The ion implanter according to claim 9, wherein the wafer transfer device comprises a transfer arm configured to hold and transfer the wafer, wherein the light source section is configured to irradiate at least two portions of the outer peripheral region of the wafer with the light, with the wafer held above the twist angle adjustment mechanism by the transfer arm, and the camera is configured to take the image of the wafer in at least two light irradiation regions, and wherein the image processing device is configured to detect a center position of the wafer on the transfer arm by using image data of the at least two light irradiation regions supplied from the camera and an end point position data of a single position of the wafer on the transfer arm which has been stored in advance and to detect a radial positional deviation of the center position from a reference position.

17. The ion implanter according to claim 9, further comprising a reflector that reflects light to irradiate the three portions on the outer peripheral region of the wafer on the twist angle adjustment mechanism.

18. The ion implanter according to claim 9, wherein the at least three portions on the outer peripheral region of the wafer are irradiated by at least three emission parts.

19. The ion implanter according to claim 9, wherein at most four portions on the outer peripheral region of the wafer are irradiated.

* * * * *